United States Patent
Zhou (10) Patent No.: US 6,553,211 B1
(45) Date of Patent: Apr. 22, 2003

(54) METHOD AND APPARATUS FOR ADJUSTING PILOT SIGNAL RELATIVE TO INPUT SIGNAL

(75) Inventor: William Wei Zhou, Randolph, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/137,915

(22) Filed: Aug. 20, 1998

(51) Int. Cl.⁷ .............................. H01Q 11/12; H03F 1/00
(52) U.S. Cl. ..................... 455/126; 455/127; 455/114; 330/151; 330/52
(58) Field of Search ................................. 455/127, 126, 455/114; 375/296, 297; 330/51, 52, 149, 151

(56) References Cited

U.S. PATENT DOCUMENTS

| | | | | |
|---|---|---|---|---|
| 5,155,448 A | * | 10/1992 | Powell | 330/149 |
| 5,485,120 A | * | 1/1996 | Anvari | 330/151 |
| 5,515,000 A | * | 5/1996 | Maruyama et al. | 330/52 |
| 5,625,893 A | * | 4/1997 | Kahn | 455/70 |
| 5,644,268 A | * | 7/1997 | Hang | 300/151 |
| 5,770,971 A | * | 6/1998 | Ncnicol | 370/331 |
| 5,796,304 A | * | 8/1998 | Gentzler | 330/52 |
| 5,838,733 A | * | 11/1998 | Bruckert | 375/297 |
| 5,862,459 A | * | 1/1999 | Charas | 455/114 |
| 5,913,152 A | * | 6/1999 | Hemphill | 455/43 |
| 5,930,242 A | * | 7/1999 | Mimura | 370/331 |
| 5,974,094 A | * | 10/1999 | Fines | 375/335 |
| 5,999,048 A | * | 12/1999 | Zhou | 330/151 |
| 6,069,527 A | * | 5/2000 | Maruyama | 330/51 |

FOREIGN PATENT DOCUMENTS

EP      0685931 A      12/1995      H03F/1/32

* cited by examiner

Primary Examiner—Vivian Chin
Assistant Examiner—John J Lee
(74) Attorney, Agent, or Firm—Julio A. Garceran (57) ABSTRACT

A pilot adjusting system adjusts the power level of the pilot relative to the power level of the input signal. For example, the pilot adjusting system detects the power level of the input signal on the signal path leading to an RF amplifier. In response to the power level of the input signal, the pilot adjusting system adjusts the power level of the pilot signal which is injected into the signal path prior to the RF amplifier. In certain embodiments, the pilot adjuster adjusts the pilot power level to maintain a desired input signal to pilot signal ratio at the input to the RF amplifier for the input signal range of the RF amplifier. As such, if the input signal power level drops 30 dB, the pilot adjuster reduces the power level of the pilot signal by 30 dB, thereby maintaining the input signal to pilot ratio throughout the input range of the RF amplifier. Other parameters of the pilot signal can be adjusted relative to other parameters for the input signal prior to the pilot signal being injected into the main signal path prior to the RF amplifier.

16 Claims, 5 Drawing Sheets

METHOD AND APPARATUS FOR ADJUSTING PILOT SIGNAL RELATIVE TO INPUT SIGNAL

BACKGROUND OF THE INVENTION

1. Field of The Invention

This invention relates to radio frequency (RF) amplifiers and, more particularly, to a pilot and input signal synchronization scheme for feed-forward RF amplifiers.

2. Description of Related Art

RF amplifiers often add undesired distortion to an input signal, creating an output RF signal on a main path comprising an amplified input signal and distortion, a significant component of which is intermodulation distortion (IMD). The distortion includes any undesired signals added to or affecting adversely the amplified input signal. IMDs of a signal arises from intermodulation of the frequency components in the signal by each other in a nonlinear system, producing waves having frequencies, among others, equal to the sums and differences of the frequency components of the original signal. Feed-forward correction is routinely deployed in modern RF amplifiers to reduce the distortion produced from the RF amplifier on the main signal path. The essence of the feed-forward correction is to isolate the distortion produced from the amplifier on a correction path so that at the final summing point, the distortion on the correction path cancels out the distortion of the RF signal on the main path.

Due to the unpredictability of input RF carrier pattern as well as the resultant location of the distortion, a known frequency component, i.e. the pilot, is injected in the main loop to mimic the distortion produced by the amplification process. In feed-forward amplifiers, the correction circuitry isolates the amplified pilot signal along with the distortion onto the correction path and manipulates the pilot signal and the distortion on the correction path to combine with and reduce the pilot and the distortion on the main signal path. The correction circuitry detects the pilot signal and attempts to cancel the pilot signal from the main signal path. In cancelling the pilot signal from the main signal path, the correction circuitry cancels the distortion.

Figure 1:
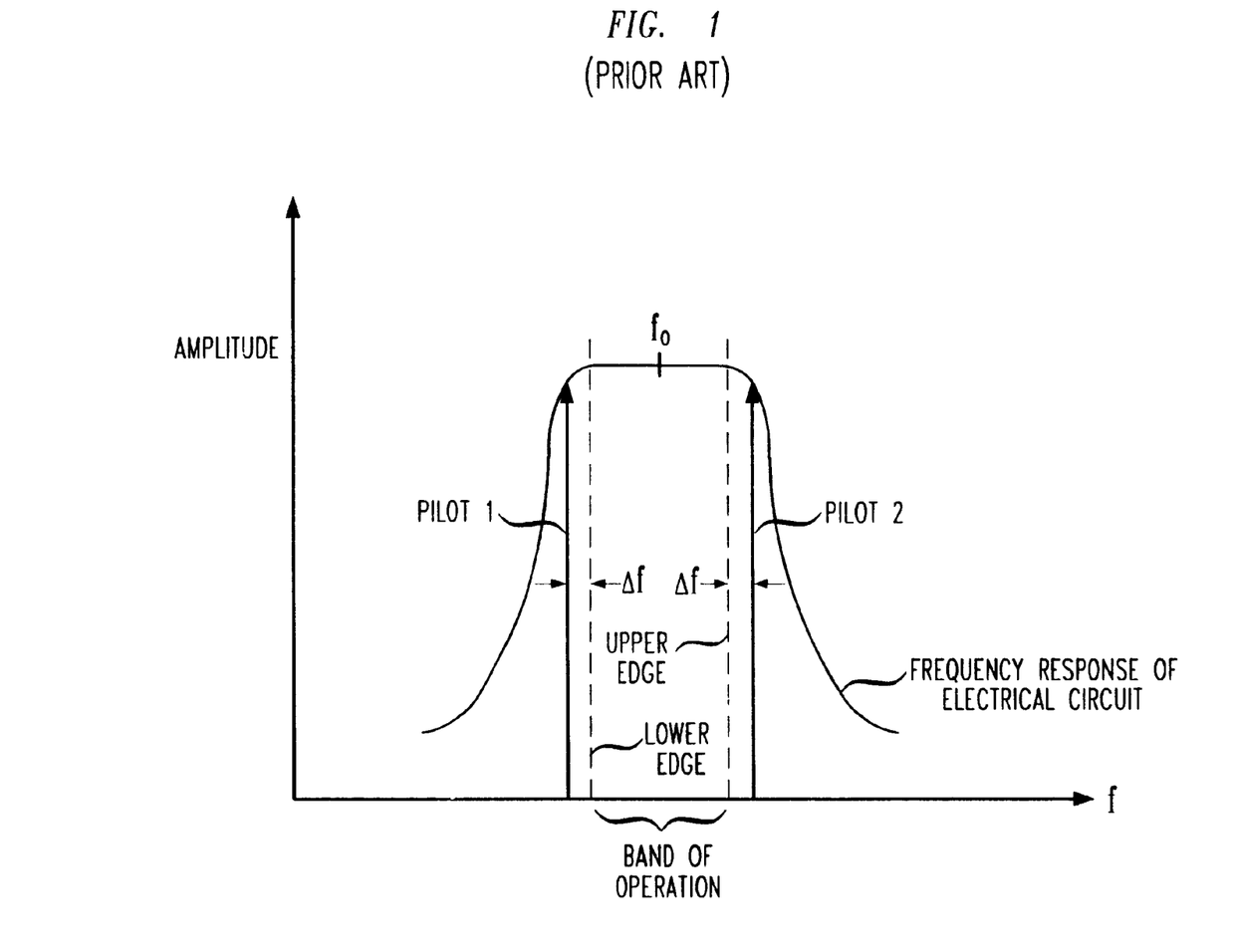
FIG. 1 shows an example frequency response curve of an RF amplifier showing the frequency within which the amplifier is operating and example pilot signals.

There are two general types of pilot signals: continuous wave (CW) and spread spectrum (SS) pilot signals. The CW pilot is easy to detect and measure, but runs the risk of being overlaid by one of the input carriers. Therefore, it is advantageous to move the CW pilot outside of the band of operation. Otherwise, the pilot frequency should be constantly updated to find a quiet location in-band where there is no input carriers. For example, FIG. 1 shows the frequency response of an RF amplifier including the location of a CW pilot signal. The pilot signal can be near the lower edge of the operating band (e.g., pilot 1) or located near the upper edge of the band of operation (e.g., pilot 2). The pilot is positioned a spectral distance of $\Delta f$ from an edge of the band of operation whose center frequency is $f_0$. As mentioned above, the pilot signal can also be located somewhere within the band of operation of the RF amplifier. The electrical characteristics (e.g., amplitude, phase response, spectral content) of the pilot signal are known. It should be noted that although the pilot signal is shown as a single spectral component of a certain amplitude, the pilot signal can comprise a plurality of spectral components having various amplitudes. Furthermore, an SS pilot can be spread across the entire operating band for the RF amplifier. The SS pilot is harder to detect and measure, but it is immune to the input carrier placement when placed in-band.

Figure 2:
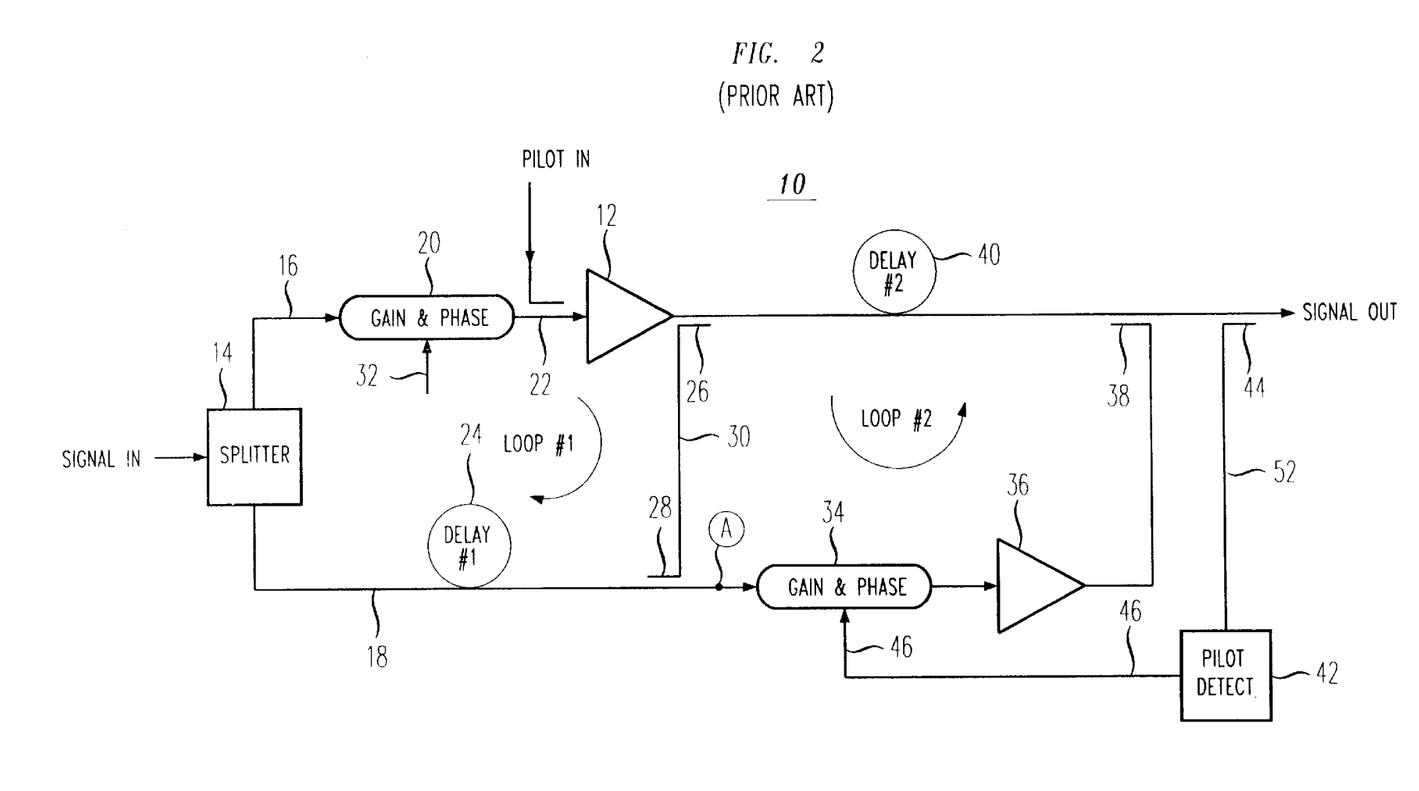
FIG. 2 is a block diagram of a feed forward distortion correction scheme used for RF amplifiers.

FIG. 2 discloses typical feed-forward correction circuitry 10, which uses information obtained from the pilot signal to reduce distortion produced by RF amplifier 12. An input signal is applied to a splitter 14. The splitter 14 replicates the input signal on a main signal path 16 and a second path 18. The splitter 14 is part of a feed forward loop referred to as loop #1, which in addition to the splitter 14, comprises gain & phase circuit 20, coupler 22, the RF amplifier 12, delay circuit 24 and couplers 26 and 28. The input signal on the main signal path 16 is applied to gain & phase circuit 20. The output of gain & phase circuit 20 and the pilot signal are applied to the coupler 22. Typically, the amplitude of the pilot signal is much less (e.g., 30 dB less) than the amplitude of the input signal so as not to create additional significant IMD components from the amplifier 12 due to the pilot signal. The output of coupler 22 is applied to the amplifier 12 whose output comprises the amplified input signal, the amplified pilot signal and distortion signals produced by the amplifier 12. A portion of the output of the amplifier 12 is obtained from the coupler 26 and is combined with a delayed version of the input signal (signal on path 18) at the coupler 28 via coupling path 30. The input signal on the path 18 has experienced sufficient delay provided by delay circuit 24, the delay of which is designed so that such signal experiences the same delay as the signal appearing at the coupler 28 via the path 30.

The gain & phase circuit 20 is controlled via control path 32 with two control signals to adjust the gain and phase of the input signal such that the input signal appearing at the coupler 28 via the path 30 is substantially the inverse (equal in amplitude but 180° out of phase) of the delayed input signal at the coupler 28. The control signal appearing on the control path 32 of the gain & phase circuit 20 is derived from the signal at point A in a well known manner through the use of detection circuits. The detection circuits detect well known electrical signal characteristics such as amplitude, phase, and frequency of the signal. Therefore, the input signals applied to the coupler 28 cancel each other leaving at point A essentially the pilot signal and the distortion produced by the amplifier 12. Loop #1 is thus a feed forward loop which serves to isolate at point A the pilot signal and distortion produced by the amplifier 12.

The signals appearing at point A (pilot signal and distortion signals) are fed to gain & phase circuit 34 whose output is fed to amplifier 36 whose output is applied to coupler 38. A portion of the output signals (input signal, pilot signal and distortion signals) of the amplifier 12 is fed to delay circuit 40 whose output is fed to the coupler 38. The delay circuit 40 is designed such that signals from the output of the amplifier 12 applied to the coupler 38 experience the same delay as the signals from the output of the amplifier 36 applied to the coupler 38.

Because the frequency, amplitude and other electrical characteristics of the pilot signal are known, pilot detect circuit 42 can use circuits such as a mixer connected to a log detector (or other well known detection circuits) to detect the pilot signal or a portion of the pilot signal via coupler 44. The pilot signal is used to obtain information about the distortion left at the final output. The information is obtained by detecting well known electrical signal characteristics of the pilot signal. In particular, the characteristics (e.g., amplitude, spectral content, phase response) of the pilot signal are known and thus when the pilot detect circuit 42 detects alterations to the pilot signal, detection circuit 42 will use such information to generate control signals onto path 46. The control signals on the path 46 cause the gain & phase circuit 34 to modify the pilot signal and distortion at point A such that the pilot signal and the distortion on the main path 16 at the coupler 38 is the inverse (equal in amplitude but 180° out of phase) of the pilot signal and the distortion on the second path 18 at the coupler 38. The corresponding pilot signals and the distortion signals at the coupler 38 cancel each other at the coupler 38 essentially leaving the amplified version of the input signal at the output of the system. Therefore, loop # 2, which comprises the coupler 26, the coupler 28, the gain & phase circuit 34, the amplifier 36, the coupler 38 and the delay circuit 40 is a feed forward loop which uses the information obtained from the distorted pilot signal to cancel substantially the distortion produced by the amplifier 12.

In current systems, as the input signal power level is decreased, the IMD power levels produced also decrease, but the pilot power level remains constant. Since the pilot level does not decrease with the rest of the spectrum, it risks standing out as the highest distortion product, unless the correction circuitry 10 can further cancel the pilot signal at the coupler 38. For example, an RF amplifier can have an input signal range of 30 dB where the input signal has an absolute power level range from 2 dBm to −28 dBm. If the input signal is at 2 dBm and the pilot signal is at −28 dBm, a 30 dB input signal to pilot ratio is achieved at the input to the amplifier 12. If the input power level changes to 0 dBm, the pilot power level remains at −28 dBm, thereby the input signal to pilot signal ratio is reduced to 28 dB. At the low end of the input signal range (for example, when the input signal is down to −28 dBm), the pilot signal remains at −28 dBm and risks becoming a significant distortion component unless the correction circuitry 10 can significantly reduce the pilot at the output of the RF amplifier. Current systems use a constant power level for the pilot signal, for example −50 dBm. In determining the power level of the pilot, the pilot signal should not become a significant source of distortion at the low end of the input signal range (e.g. −28 dBm), and the pilot signal should be sufficient to cancel the distortion from the output of the amplifier 12 at the high end of the input signal range (e.g. 2 dBm). However, certain compromises are made in using a constant power level for the pilot signal. For example, at the high end of the input signal range, the correction circuitry has difficulty in reducing the distortion from the output the amplifier 12 because the distortion power level is generally higher with higher input signal power levels. At the low end of the input signal range, the pilot signal becomes a source of distortion.

SUMMARY OF THE INVENTION

The present invention involves a pilot adjusting system which adjusts the pilot signal relative to the input signal. For example, the pilot adjusting system detects the power level of the input signal on the signal path leading to an RF amplifier. In response to the power level of the input signal, the pilot adjusting system adjusts the power level of the pilot signal which is injected into the signal path prior to the RF amplifier. In certain embodiments, the pilot adjuster adjusts the pilot power level to maintain a desired input signal to pilot signal ratio at the input to the RF amplifier for the input signal range of the RF amplifier. As such, if the input signal power level drops 30 dB, the pilot adjuster reduces the power level of the pilot signal by 30 dB, thereby maintaining the input signal to pilot ratio throughout the input range of the RF amplifier. Other parameters of the pilot signal, such as phase and/or frequency, can be adjusted relative to other parameters for the input signal prior to the pilot signal being injected into the main signal path prior to the RF amplifier.

BRIEF DESCRIPTION OF THE DRAWINGS

Other aspects and advantages of the present invention may become apparent upon reading the following detailed description and upon reference to the drawings in which.

DETAILED DESCRIPTION

Figure 3:
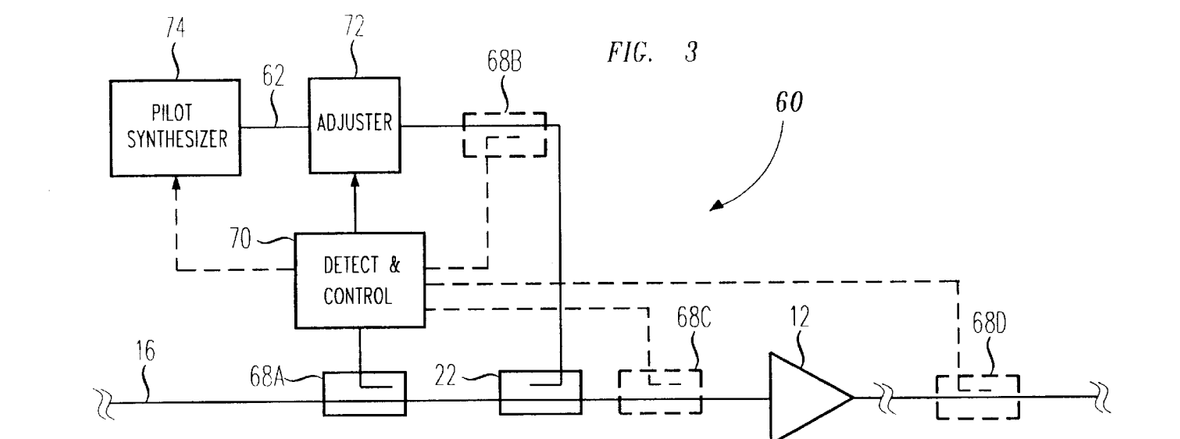
FIG. 3 shows an embodiment of a pilot level adjusting system according to the principles of the present invention.

Illustrative embodiments of the pilot level adjusting system for use with RF amplifiers according to the principles of the present invention are described below. FIG. 3 shows a general block diagram of a pilot level adjusting system 60 which adjusts the power level of a pilot signal on the pilot signal injection path 62 relative to the power level of an input signal, such as a carrier signal(s), on the main signal path 16 leading to the RF amplifier 12. A coupler 68a couples a portion of the input signal from the signal path 16 before the RF amplifier 12. Detect and control circuitry 70 determines the power level of the input signal and provides adjustment signals to adjuster 72 to adjust the power level of the pilot signal. The detect and control circuitry 70 can receive alternative and/or additional inputs shown by the dotted lines and couplers 68b–d to provide power level information. Other inputs are also possible depending on the application. In certain embodiments, the detect and control circuitry 70 provides adjustment signals such that the changes in the power level of the pilot signal track the changes in the power level of the input signal. Alternatively, the adjustment signals can be determined based on the input signal power level to maintain a desired input signal to pilot signal ratio or retrieved from a look-up table based on the input signal power level. Additionally, the adjustment signals can be determined to provide an input signal to pilot signal ratio based on the degree of correction performed by correction circuitry compared to that desired.

A pilot synthesizer 74 produces the pilot signal on the pilot injection path 12. The pilot signal can be a continuous wave (CW) pilot, a spread spectrum pilot, a modulated pilot, a pilot of varying frequency, or a pilot having different frequency components. The coupler 22 then injects the pilot signal into the signal path 16 before the RF amplifier 12. After being amplified by the amplifier 12, the feed forward correction scheme (FIG. 2) as known in the art attempts to cancel the pilot signal from the signal path 16, thereby reducing the distortion. If the pilot signal level remains the same while the input signal level is reduced at the input to the RF amplifier 12, the feed forward correction circuitry (FIG. 2) must cancel more of the output pilot signal to maintain an acceptable output signal to pilot signal ratio at the coupler 38 (FIG. 2) of the feed forward correction circuitry (FIG. 2). If not, the pilot signal can result in distortion. By maintaining the power level of the pilot relative to the power level of the input signal, the desired input signal to pilot ratio can be achieved and/or maintained, and the correction circuitry (FIG. 2) need only cancel the pilot signal by the same amount (in dB) at the output of the correction circuitry (FIG. 2) throughout the input signal range. The reduction of the pilot signal still leads to the effective reduction of the IMDs because the power level of the worst-case IMDs also follow the power level of the input signal. If the input signal level increases and the pilot signal remains the same, the worst-case IMDs also increase, and the correction circuitry (FIG. 2) may fail to cancel the distortion.

Figure 4:
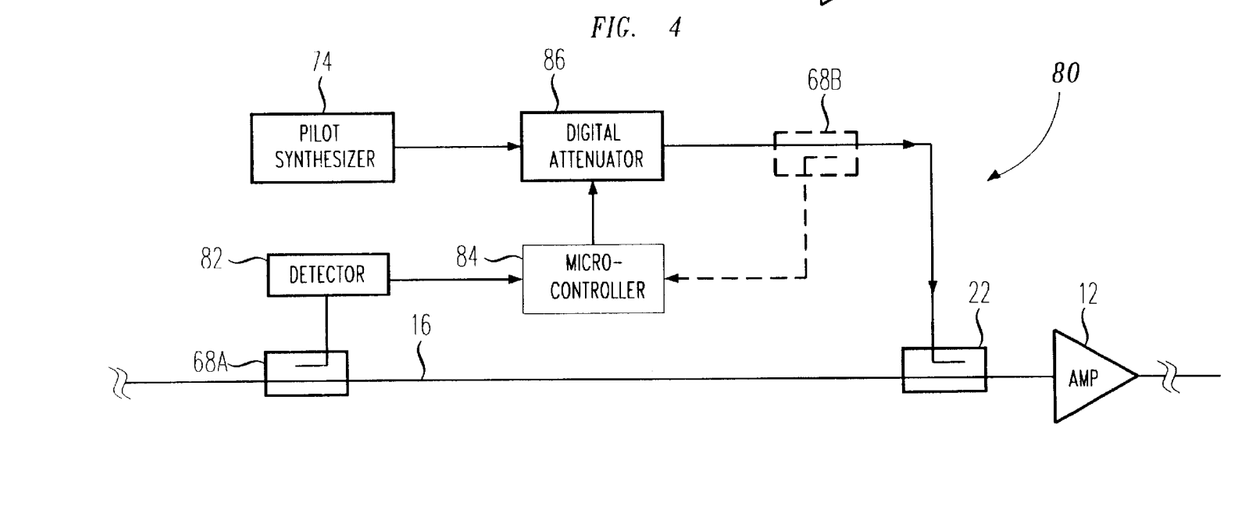
FIG. 4 shows an embodiment of the pilot level adjusting system.

FIG. 4 shows an embodiment of a pilot level adjusting system 80 according to the principles of the present invention. In this embodiment, the coupler 68a provides a sample of the input signal(s) on the signal path 16, and an RF power detector 82 provides a voltage signal representing the input power level. The pilot level adjusting system 80 uses a controller 84 which digitizes the output of the RF power detector 82 and programs a digital attenuator 86 to provide the appropriate power level for the pilot signal depending upon the input power level. For example, to achieve a 30 dB ratio between the input signal power level and the pilot power level, a 2 dBm input power level would result in a −28 dBm pilot signal power level at the input to the RF amplifier 12.

The controller 84 can continuously monitor the input power level. For example, a sample of the input power level can be taken every microsecond. In response to the input power level and/or a change in the input power level, the controller 86 can determine the appropriate power level and/or attenuation level for the pilot signal given the desired input signal to pilot signal ratio. The controller 84 then provides the corresponding control signals to the digital attenuator 86. Alternatively, the controller 84 could retrieve the appropriate power level and/or attenuation level from a look up table(s) and provide the corresponding control signals to the digital attenuator 86. As such, the pilot level adjusting system can maintain an adequate input signal to pilot ratio and enable the feed forward correction circuitry (FIG. 2) to more easily cancel the pilot signal while still reducing the IMDs to produce an output having a desired output signal to distortion (including pilot signal and IMD's) ratio. Depending on the application, different embodiments can use different sampling rates of the input signal, and the controller 84 can dynamically change the power level of the pilot signal with changes to the input signal. The changes to the input signal can be based on the latest sample of the power level of the input signal, on the average of several power level samples of the input signal. Alternative embodiments can measure other characteristics or parameters of the input signal. The controller 84 could also provide control signals that result in a change in the input signal to pilot signal ratio depending on the power level of the input signal or other characteristics or parameters of the input signal. As such, a desired input signal to pilot signal ratio or a desired relative difference between parameters of the input signal and pilot signal can be provided depending on the input signal power level or other parameters of the input signal.

Figure 5:
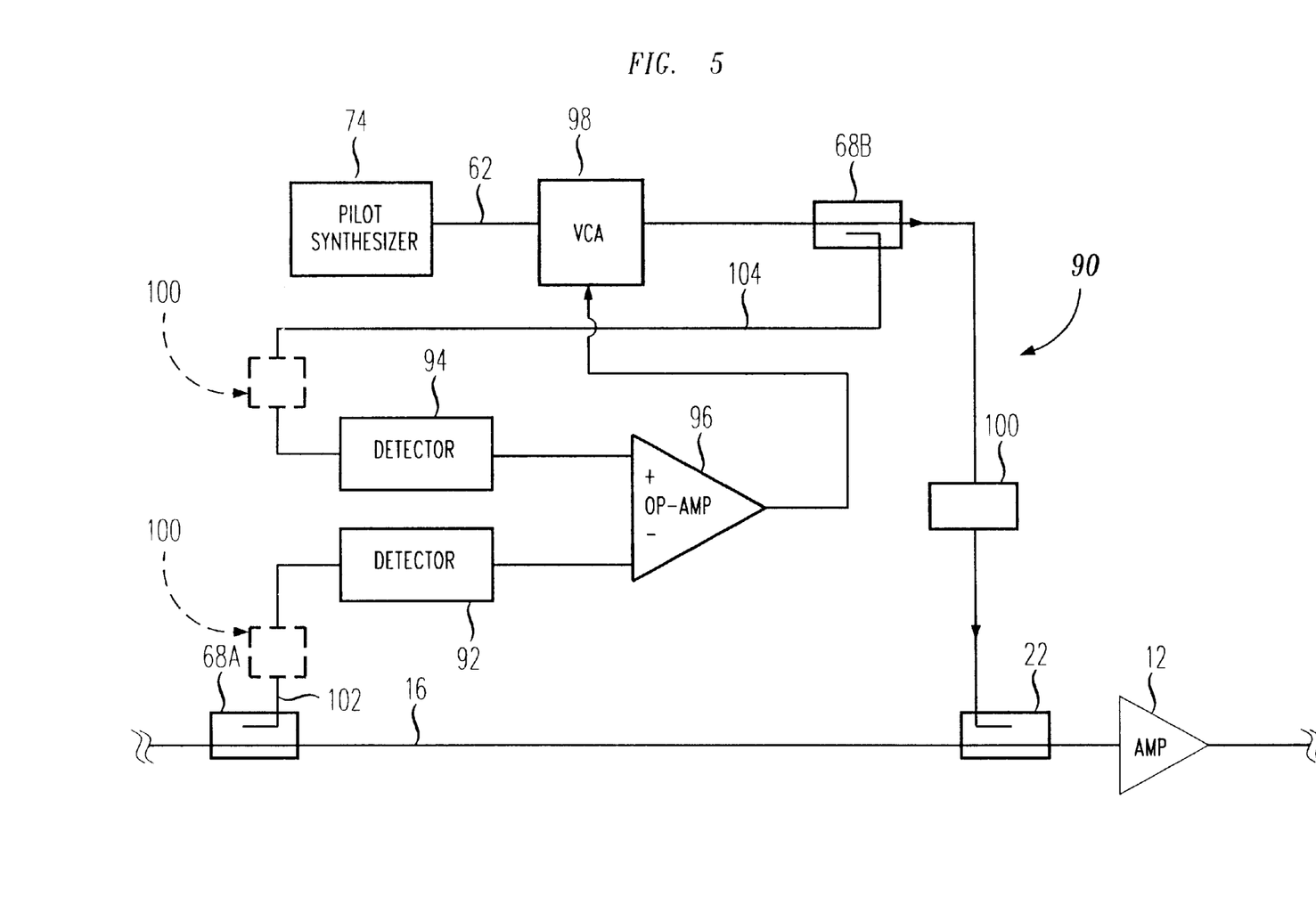
FIG. 5 shows another embodiment of the pilot level adjusting system.

FIG. 5 shows an embodiment of a pilot level adjuster 90 where measurements of the input power level and the adjusted pilot power level are used to adjust the pilot power level. The pilot level adjuster locks or synchronizes the adjusted pilot power level to the input power level. In this embodiment, the coupler 68a provides a sample of the input power level on the signal path 16 to a RF power detector 92, and the coupler 68b provides a sample of the adjusted pilot signal on the pilot injection path 62 to a RF power detector 94. The input power level detector 92 produces a voltage signal representative of the input power level, and the pilot power level detector 94 produces a voltage signal representative of the adjusted pilot level. The outputs of the two detectors 92 and 94 are provided as the inputs of a control arrangement 96. The output of the control arrangement 96 controls a voltage controlled attenuator (VCA) 98 located after the pilot synthesizer 74. Using an infinite gain op-amp configuration in this embodiment, the output of the control arrangement 96 adjusts the attenuation of the VCA 98 until the two inputs from the RF detectors 92 and 94 are equal. Other circuit configurations are possible.

It is possible to maintain a relatively constant input signal to pilot ratio by maintaining an offset or power level difference between the input signal and the pilot signal at the input to the amplifier 12. To set a desired constant input signal to pilot ratio, an offset or difference between the input power level and the pilot power level is established and maintained. An attenuator(s) 100 can be placed at different points to provide the desired difference or offset between the input power level and the pilot power level on the main path 16. In determining the appropriate level of attenuation for the attenuator(s) 100, the losses introduced by the couplers 68a–b and 22 should be considered. A typical coupler can introduce 10 dB of attenuation on the secondary leg of the coupler and 0.5 dB on the main leg. For example, the coupler 68a provides 10 dB of attenuation to the input signal coupled onto the input power detection path 102 from the secondary leg of the coupler 68a and 0.5 dB of attenuation of the input signal on the main path 16 from the main leg of the coupler 68a. Different types of couplers and/or coupling devices can be used. For example, a 3 dB splitter could be used in place of the coupler 68b which splits the pilot signal onto the pilot injection path 62 and the pilot injection path 104 and attenuates the pilot signal by 3 dB on both paths 62 and 104. In this embodiment, an attenuator 100 is connected between the coupler 68b and the input coupler 22 on the pilot signal injection path 62 to provide a constant difference between the input power level and the pilot power level at the input to the amplifier 12, thereby maintaining the input signal to pilot ratio. Alternative configurations are possible to establish the constant difference or offset between the input signal power level and the pilot power level.

Alternative embodiments can provide a variable input signal to pilot signal ratio at the input to the amplifier 12 by varying the offset between the input signal power level and pilot signal power level at the input to the amplifier 12. The amount of offset can dynamically change depending on changing operating performance, parameters or characteristics, such as input signal level or based on the degree of correction and/or distortion measured at the output of the correction circuitry which can be compared to a desired operating performance or a previous degree of performance. The variable input signal to pilot signal ratio can be dynamically changed by using a variable attenuator, which can be controlled to achieve the desired varying offset, rather than the fixed attenuator(s) 100, and/or by changing the manner in which the VCA 98 is controlled.

In this embodiment, as the RF input power level changes, the output of the op-amp arrangement 96 will automatically adjust the VCA 98 until the output of the pilot detector 94 equals the output of the input power detector 92. As such, the pilot power level is synchronized or locked with the input signal power level. By setting the desired offset between the input signal and pilot signal, the desired ratio between them can be achieved and maintained. This implementation is simple and in-expensive. Crude detectors 92 and 94 with non-linear voltage vs. power characteristic curves could be used, but as long as the two detectors 92 and 94 provide similar or matching responses over the input range of the RF amplifier 12, the system 90 should maintain the offset between the input power level and the pilot power level. Additionally, the VCA 98 could have a poor voltage vs.

attenuation curve, but the control arrangement still maintains the desired input signal to pilot signal ratio. Since the control arrangement 96 attempts to equalize the adjusted pilot level and the input power level (minus relative offsets) by adjusting the pilot power level, the closed loop configuration of the system 90 maintains the offset between the pilot power level and the input power level, thereby maintaining the input signal to pilot signal ratio.

Figure 6:
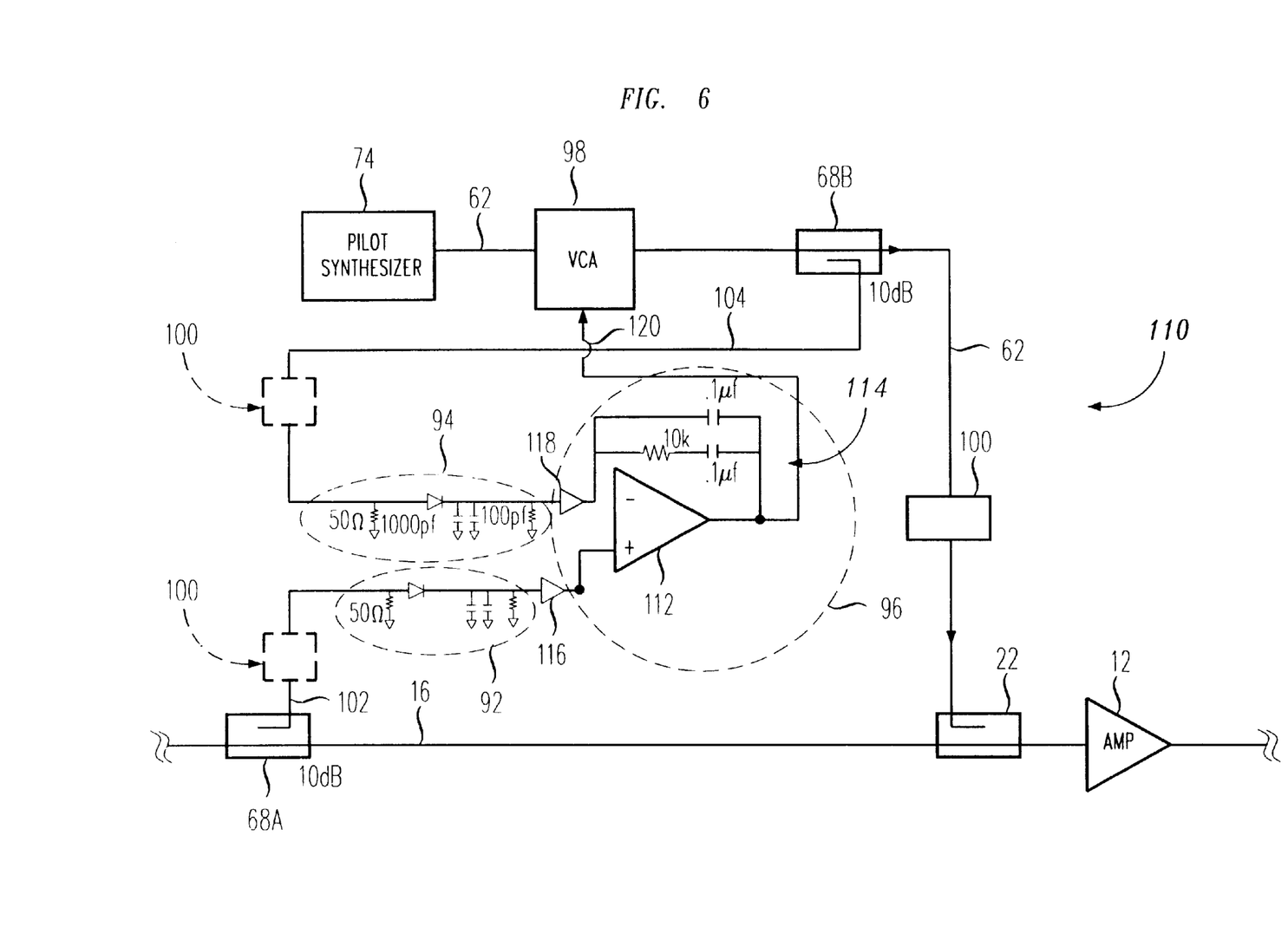
FIG. 6 shows a more detailed embodiment of the pilot adjusting system of FIG. 5.

FIG. 6 shows a detailed embodiment 110 of the pilot level adjuster 90 of FIG. 5. The pilot synthesizer 74 generates the desired pilot signal with a particular power level. Using the configuration of FIG. 6, the VCA 98 can be a simple, low-cost pin-diode attenuator that has an attenuation range of for example 40 dB and a nonlinear voltage vs. attenuation curve. In this embodiment, the coupler 68b is a 10 dB coupler that couples the energy off the adjusted pilot from the pilot injection path 62. The 10 dB coupler 68b replicates the adjusted pilot onto a pilot detection path 104, so the sample of the pilot signal on the pilot detection path 104 is attenuated by about 10 dB. The coupler 68b attenuates the adjusted pilot on the pilot injection path 62 by about 0.5 dB. The sample of the pilot signal on the pilot detection path 104 is provided to the pilot detector 94. In this embodiment, the pilot detector 94 is simply a zero-biased Schottky diode detector which is not a highly linear RMS RF power detector. The pilot detector 94 does have operating characteristics that match the response of the input power detector 92 over the input range for the RF amplifier 12. Accordingly, in this embodiment, the input power detector 92 is also shown as a simple zero-biased Schottky diode detector. The pilot power detector 94 provides a pilot power detection signal in response to the pilot signal on the pilot power detection path 104.

The input power detector 92 receives a sample of the input signal from the coupler 68a. The coupler 68a replicates the input signal onto an input signal detection path 102, so the sample of the input signal on the input signal detection path 102 is attenuated by about 10 dB. As mentioned above for the coupler 68b, the coupler 68a attenuates the input signal on the main signal path 16 by about 0.5 dB. The input power detector 92 produces an input power detection signal in response to the sample of the input signal on the input signal detection path 102.

In this embodiment, the control arrangement 96 is an operational amplifier arrangement 96. The op-amp arrangement 96 includes an op-amp 112 and its associated feedback network 114, which maintains the circuit stability and sets the response time (for example, 1 millisecond to 1 microsecond or less depending on the application). The op-amp arrangement 96 receives the input power detection signal from the input power detector 92 and the pilot power detection signal from the pilot power detector 94 and attempts to maintain them equal. In this embodiment, two non-inverting amplifiers 116 and 118 amplify the respective outputs of the input power detector 92 and the pilot power detector 94 to improve detection resolution. As the input power level changes, the op-amp arrangement 96 maintains the desired offset between the input power level and the pilot power level by adjusting the pilot power level relative to the input power level. To do so, the op-amp arrangement 96 provides a control signal to the VCA 98 which changes the level of attenuation for the pilot signal on the pilot injection path 12 to equalize the inputs to the op-amp arrangement 96, thereby reflecting changes in the input power level. In this embodiment, the control signal is a voltage signal which decreases (increases) in voltage when the input power level decreases (increases) to increase (decrease) the attenuation of the pilot signal on the pilot injection path 62.

The adjusted pilot signal on the pilot injection path 62 is attenuated by an attenuator 100 on the pilot injection path 62 to set the input signal power to pilot signal power ratio. The attenuator 100 can be a fixed valued pi-pad attenuator (using 3 resistors as would be understood by one skilled in the art). The attenuation value for the attenuator 100 along with the relative losses experienced by the input signal, the pilot signal and the samples thereof set the desired input signal to pilot ratio initially. Once set, the system 110 maintains the ratio between the input signal power level and the pilot power level as the input power level changes. The adjusted pilot signal from the attenuator 100 is injected onto the main signal path 16 using the coupler 22. In this embodiment, the coupler 22 is a 10 dB coupler that couples the adjusted pilot with 10 dB of attenuation into the signal path 16 to the RF amplifier 12. Depending on the particular application, the attenuator 100 in the pilot injection path 62 can be removed and the relative difference between the input power level and the pilot power level be established with attenuator(s) on the input power detection path 102 and/or on the pilot power detection path 104. Alternatively, a variable input signal to pilot signal ratio can be achieved by using a variable attenuator(s) 100 and/or controlling the VCA to provide the desired variable offset.

For an example implementation in which a difference of 30 dB is desired and maintained between the input power level and the pilot power level at the input to the RF amplifier 12, the input power level is at 2 dBm and the pilot synthesizer 74 produces a pilot signal at 5 dBm. For discussion purposes and ignoring the losses across the main legs of the couplers 22 and 68a–b, a pilot power level of −28 dBm is desired at the output of the coupler 22 for a 2 dBm input power level. The VCA 98 can be initially set as providing 3 dB of attenuation to the 5 dBm pilot signal from the pilot synthesizer 74, thereby providing a 2 dBm pilot signal on the pilot injection path 62. The coupler 68b on the pilot injection path 62 replicates the adjusted pilot signal onto the pilot power detection path 104 and attenuates the adjusted pilot on the pilot detection path 104 by 10 dB so that the pilot power level on the pilot power detection path 104 is −8 dBm. The coupler 68b also provides the adjusted pilot signal from the main leg of the coupler 68b onto the pilot injection path 62 to an attenuator 100.

To maintain the 30 dB ratio between the input power level (2 dBm in this example assuming no attenuation on the main legs of the couplers 68a and 22) and the pilot power level at the input to the RF amplifier 12, the pilot power level should be equal to −28 bBm at the input to the RF amplifier. In this example, to achieve a pilot signal level of −28 dBm at the RF amplifier 12, the attenuator 100 on the pilot injection path 62 is set to provide 20 dB of attenuation to the adjusted pilot signal on the pilot injection path 62. In this example, the attenuator 100 receives the adjusted pilot signal at 2 dBm and attenuates the adjusted pilot signal by 20 dB to −18 dBm. The adjusted pilot signal at −18 dBm is provided to the secondary leg of the coupler 22 which attenuates the adjusted pilot signal by 10 dB and injects the pilot signal onto the main path 16 at −28 dBm.

The input signal is received by the coupler 68a, and a sample of the input signal is produced at the secondary leg of the coupler 68a onto the input signal detection path 102. In this example, the coupler 68a attenuates the sample produced on the input power detection path by 10 dB to −8 dBm. As such, the input signal power level on the input signal power detection path 102 and the pilot power level on the pilot power detection path 104 are equal at −8 dBm. If the input signal power level drops, the input signal power level on the input signal detection path 102 drops. In response, the control arrangement 96 attempts to equalize the input to the pilot power detector 94 with the input to the pilot power detector 94 by increasing the attenuation of the VCA 98 via a control signal on the control line 120.

For example, if the input signal drops to −1 dBm, the input signal on the input power detection path 102 drops to −11 dBm. The op-amp arrangement 96 attempts to equalize the −8 dBm pilot signal on the pilot power detection path 104 with the −11 dBm signal on the input power detection path 102 by increasing the attenuation of the VCA 98 on the pilot injection path 62. When the VCA attenuates the pilot signal by 6 dB to −1 dBm at the input to the coupler 68b, the pilot signal on the pilot power detection path 104 reaches −11 dBm, and the pilot signal at the input of the RF amplifier 12 reaches −31 dBm. Thus, the ratio of the input signal power level (−1 dBm in this example) and the pilot power level (−31 dBm) at the input to the RF amplifier 12 is maintained at 30 dB for changing input signal power levels.

In addition to the embodiments described above, alternative configurations of the pilot level adjustment system according to the principles of the present invention are possible which omit and/or add components and/or use variations or portions of the described system. For example, the example above is provided for discussion purposes to show how the pilot level adjuster can provide and maintain a 30 dB offset between the input power level and the pilot power level on the signal path 16. Depending on the particular design and the input voltage v. attenuation characteristics of the variable attenuator on the pilot injection path, the pilot adjusting system can maintain the desired offset between the pilot power level and the input power level for different ranges of input signal power levels. To take advantage of the full range of attenuation provided by the variable attenuator, the various signal power levels must be considered and additional attenuators or components which can attenuate signals can be placed in the various paths. Additionally, variable attenuators or attenuation arrangements with increased attenuation ranges can be used to increase the range of input signal power levels in which the pilot adjusting system provides the desired ratio between the input signal power level and the pilot power level.

The pilot adjusting system has been described as using couplers, but 3dB splitters and other coupling, signal splitting or sampling devices can be used in place of the couplers. Additionally, the pilot adjusting system is described with fixed attenuators, but variable attenuators or other devices which provide signal attenuation can be used in place of the fixed attenuators. Such a variable attenuator can be controlled to dynamically change the input power level to pilot power level ratio. The pilot level adjustment system has been further described as using different configurations of discrete components, but it should be understood that the pilot level adjustment system and portions thereof can be implemented in application specific integrated circuits, software-driven processing circuitry, firmware or other arrangements of discrete components as would be understood by one of ordinary skill in the art with the benefit of this disclosure.

The embodiments of the pilot adjustment system have been described as being used with feed-forward RF amplifier arrangements, but the pilot adjustment system can be used in any amplifier arrangement where a pilot signal is used and the input pilot power level is adjusted relative to the input power. Additionally, the pilot adjusting system has been described as adjusting the pilot power level relative to an input signal power level, but the pilot adjusting system can adjust pilot power level based on the averages of multiple carriers or signals, the highest power level carrier or signals and/or combinations thereof related to input power level. Furthermore, the pilot adjustment system has been described as adjusting pilot signal power level relative to input signal power level, but other parameters or characteristics of the pilot signal can be adjusted based on the characteristics or parameters of the input signal. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of using a pilot signal, said method comprising the steps of:

producing a signal on a main signal path and a portion of said signal on a feed forward path;

adjusting a power level of a pilot signal on a pilot injection path relative to a power level of said signal on said main signal path to produce a change in said power level of said pilot signal where the amount of said change depends on said power level of said signal on said main signal path;

injecting said adjusted pilot signal onto said main signal path before an amplifier on said main signal path;

amplifying said signal and said adjusted pilot signal on said main signal path;

obtaining a portion of said amplified signal and said amplified pilot signal from said main signal path;

combining said portion of said amplified signal and said amplified pilot signal with said portion of said signal on said feed forward path to produce a pilot signal on said feed forward path; and injecting said pilot signal on said feed forward path onto said main signal path.

2. The method of claim 1 wherein said step of adjusting further includes the steps of:

maintaining a signal power level to pilot power level ratio.

3. The method of claim 1 wherein said step of adjusting includes the step of:

adjusting the attenuation of said pilot signal in response to signal power level.

4. The method of claim 1 further including the step of:

detecting the pilot power level; and wherein said step of adjusting includes adjusting the attenuation of said pilot signal in response to said signal power level and said pilot power level.

5. The method of claim 4 wherein pilot power level is detected after said step of adjusting said pilot power level.

6. The method of claim 1 wherein said second step of injecting further including the steps of:

amplifying said pilot signal on said feed forward path;

adjusting the relative phase and amplitude between said pilot signal on said feed forward path and said amplified pilot signal on said main signal path; and combining said pilot signal from said feed forward path with said amplified pilot signal on said main signal path to reduce said amplified pilot signal on said main signal path.

7. A pilot signal system comprising:

a main signal path configured to carry a signal to be amplified by an amplifier on said main signal path;

a spitting device configured to receive said signal and provide said signal to said main signal path and a feed forward path;

a pilot adjuster configured to respond to said power level of said signal on said main signal path by adjusting a power level of a pilot signal on a pilot injection path relative to said power level of said signal on said main signal path to produce a change in said power level of said pilot signal where the amount of said change depends on said power level of said signal on said main signal path;

a combining device on said main signal path configured to inject an adjusted pilot signal from said pilot injection path onto said main signal path before said amplifier on said main signal path;

said amplifier on said main signal path configured to amplify said signal and said adjusted pilot signal on said main signal path;

a second splitting device on said main signal path configured to provide a portion of said amplified signal and said amplified pilot signal from said main signal path;

a second combining device configured to combine said portion of said amplified signal and said amplified pilot signal and said signal on said feed forward path to produce a pilot signal on said feed forward path; and feed forward circuitry configured to inject said pilot signal on said feed forward path onto said main signal path.

8. The system of claim 7 wherein said pilot adjuster comprising:

a detector coupled to said main signal path for detecting the power level of said signal and producing a power detection signal from said detector representing said power level of said signal;

a variable attenuator on said pilot injection path attenuates said pilot signal according to an attenuation signal; and control circuitry responsive to said power detection signal by providing said attenuation signal to said variable attenuator.

9. The system of claim 8 wherein said pilot adjuster further comprising:

pilot power detection circuitry coupled to said pilot injection path for detecting the power level of said pilot signal and producing a pilot power detection signal representing the power level of said pilot signal; and said control circuitry further configured to be responsive to said pilot power detection signal and said power detection signal in providing said attenuation signal.

10. The system of claim 7 wherein said feed forward loop including:

a second amplifier on said feed forward path configured to amplify said pilot signal on said feed forward path;

a gain and phase adjuster configured to adjust the relative phase and amplitude between said pilot signal on said feed forward path and said amplified pilot signal on said main signal path; and a third combining device on said main signal path configured to combine said pilot signal from said feed forward path with said amplified pilot signal on said main signal path to reduce said amplified pilot signal on said main signal path.

11. A method of using a pilot signal, said method comprising the steps of:

splitting a signal onto a main signal path and a feed forward path;

adjusting a parameter of a pilot signal on a pilot injection path depending on a parameter of said signal on said main signal path;

injecting said adjusted pilot signal onto said main signal path before an amplifier on said main signal path;

amplifying said signal and said adjusted pilot signal on said main signal path;

obtaining a portion of said amplified signal and said amplified pilot signal from said main signal path;

combining said portion of said amplified signal and said amplified pilot signal with said signal on said feed forward path to produce a pilot signal on said feed forward path; and using said pilot signal on said feed forward path to reduce said amplified pilot signal on said main signal path.

12. The method of claim 11 wherein said step of using further including the steps of:

amplifying said pilot signal on said feed forward path;

adjusting the relative phase and amplitude between said pilot signal on said feed forward path and said amplified pilot signal on said main signal path; and combining said pilot signal from said feed forward path with said amplified pilot signal on said main signal path to reduce said amplified pilot signal on said main signal path.

13. A pilot signal system comprising:

a spitting device configured to receive a signal and provide a signal to a main signal path and a feed forward path;

said main signal path configured to carry a signal to be amplified by an amplifier on said main signal path;

a pilot adjuster configured to respond to a parameter of said signal on said main signal path by adjusting a parameter of a pilot signal on a pilot injection path depending on said parameter of said signal;

a first combining device on said main signal path configured to inject said adjusted pilot signal from said pilot injection path onto said main signal path;

said amplifier on said main signal path after said first combining device configured to amplify said signal and said adjusted pilot signal on said main signal path;

a second splitting device on said main signal path configured to provide a portion of said amplified signal and said amplified pilot signal from said main signal path;

a second combining device configured to combine said portion of said amplified signal and said amplified pilot signal on said feed forward path to produce a pilot signal on said feed forward path; and a feed forward loop including said feed forward path configured to use said pilot signal on said feed forward path to reduce said amplified pilot signal on said main signal path.

14. The system of claim 13 wherein said feed forward loop including:

a second amplifier on said feed forward path configured to amplify said pilot signal on said feed forward path;

a gain and phase adjuster configured to adjust the relative phase and amplitude between said pilot signal on said feed forward path and said amplified pilot signal on said main signal path; and a third combining device on said main signal path configured to combine said pilot signal from said feed forward path with said amplified pilot signal on said main signal path to reduce said amplified pilot signal on said main signal path.

15. A method of using a pilot signal, said method comprising the steps of:

splitting a signal onto a main signal path and a feed forward path;

adjusting a power level of a pilot signal on a pilot injection path relative to a power level of said signal on said main signal path;

injecting said adjusted pilot signal onto said main signal path before an amplifier on said main signal path;

amplifying said signal and said adjusted pilot signal on said main signal path;

obtaining a portion of said amplified signal and said amplified pilot signal from said main signal path;

combining said portion of said amplified signal and said amplified pilot signal with said signal on said feed forward path to produce a pilot signal on said feed forward path; and using said pilot signal on said feed forward path to reduce said amplified pilot signal on said main signal path.

16. A pilot signal system comprising:

a spitting device configured to receive said signal and provide said signal to a main signal path and a feed forward path;

said main signal path configured to carry a signal to be amplified by an amplifier on said main signal path;

a pilot adjuster configured to respond to said power level of said signal on said main signal path by adjusting a power level of a pilot signal on a pilot injection path relative to said power level of said signal;

a first combining device on said main signal path configured to inject said adjusted pilot signal onto said main signal path from said pilot injection path before said amplifier on said main signal path;

said amplifier on said main signal path configured to amplify said signal and said adjusted pilot signal on said main signal path;

a second splitting device on said main signal path configured to provide a portion of said amplified signal and said amplified pilot signal from said main signal path;

a second combining device configured to combine said portion of said amplified signal and said amplified pilot signal and said signal on said feed forward path to produce a pilot signal on said feed forward path; and a feed forward loop including said feed forward path configured to use said pilot signal on said feed forward path to reduce said amplified pilot signal on said main signal path.

* * * * *